US010951230B1

(12) United States Patent
Lecler et al.

(10) Patent No.: US 10,951,230 B1
(45) Date of Patent: Mar. 16, 2021

(54) METHOD AND APPARATUS FOR TERNARY MAPPING

(71) Applicant: QUALCOMM Incorporated, San Diego, CA (US)

(72) Inventors: Jean-Jacques Lecler, Antibes (FR); Christophe Jean-Luc Layer, Paris (FR)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/820,780

(22) Filed: Mar. 17, 2020

(51) Int. Cl.
*H03M 7/00* (2006.01)
*H03M 7/30* (2006.01)
*G11C 11/418* (2006.01)

(52) U.S. Cl.
CPC .......... *H03M 7/30* (2013.01); *G11C 11/418* (2013.01)

(58) Field of Classification Search
CPC .............................. H03M 7/30; G11C 11/418
USPC ...................................................... 341/50, 51
See application file for complete search history.

(56) References Cited

U.S. PATENT DOCUMENTS

| 7,535,387 | B1* | 5/2009 | Delva | H03M 7/4006 |
| | | | | 341/107 |
| 10,402,166 | B2* | 9/2019 | Chatwin | G06F 7/523 |
| 10,409,556 | B2* | 9/2019 | Rose | G06F 7/49931 |
| 10,763,890 | B2* | 9/2020 | Mohajer | H03M 7/165 |
| 2011/0280314 | A1* | 11/2011 | Sankaran | H04N 19/42 |
| | | | | 375/240.25 |
| 2017/0228215 | A1* | 8/2017 | Chatwin | G06F 7/5045 |
| 2018/0121166 | A1* | 5/2018 | Rose | G06F 7/49931 |
| 2019/0121839 | A1* | 4/2019 | Mohajer | G06F 7/58 |
| 2019/0149166 | A1* | 5/2019 | Mohajer | H03M 13/2903 |
| | | | | 341/118 |

* cited by examiner

*Primary Examiner* — Jean B Jeanglaude
(74) *Attorney, Agent, or Firm* — Qualcomm Incorporated

(57) ABSTRACT

In certain aspects, a circuit for modulo-3 operation has an encoder stage coupled to a binary number, wherein the encoder stage includes one or more encoders, each one of the one or more encoders receives one or two binary bits of the binary number and generates a unary code of encoder. The circuit for modulo-3 operation further has one or more levels of reduction stage, wherein a first level of the one or more levels of reduction stage includes one or more mergers of first reduction, each one of the one or more mergers of first reduction receives two unary codes of encoder or a unary code of encoder and a bit from the binary number and generates a unary code of first reduction.

20 Claims, 12 Drawing Sheets

METHOD AND APPARATUS FOR TERNARY MAPPING

BACKGROUND

Field

Aspects of the present disclosure relate to ternary mapping, and more particularly, to method and apparatus for modulo-3 operation in digital electronic systems.

Background

In computing, interleaved memory is a design used to increase the throughput. The core idea is to split the memory system into independent memory channels and spread memory addresses evenly across the independent memory channels, which can answer read or write requests independently and in parallel. That way, contiguous memory reads and writes use each memory channel in turn, resulting in higher memory throughput due to reduced waiting for memory channels to become ready for the operations. Due to the structure of the memory address, $2^k$-way interleave is most common, where k is a positive integer. For example, in a 2-way memory interleave, the memory is divided into two memory channels. One bit of the memory address (often the least significant address bit) is used to identify the memory channels, logic "0" for the first channel and logic "1" for the second channel. Similarly, for a 4-way memory interleave, the memory is divided into four memory. Two address bits are used to identify the memory channels, logic "00", "01", "10", and "11" for each.

While 2-way and 4-way memory interleaves are common, it is not uncommon to have a need of 3-way memory interleave, where there are three memory channels. However, in a 3-way memory interleave, mapping memory address to each memory channel is more complex. It requires modulo operation (abbreviated "mod", or "%" in math). The modulo operation is to find the remainder when dividing. For a 3-way memory interleave, it requires modulo-3 operation on the addresses. That is, it requires finding the remainder of the addresses when divided by 3.

Let X be the integer binary number which we need to compute the remainder modulo-3, we have $$X(\%3) \equiv \sum_{i=0}^{\frac{N}{2}} (x_{2i} - x_{2i+1})(\%3),$$

where N is the number of binary bits, $x_i$ denotes $i^{th}$ bit of X Therefore, X (% 3) is congruent to the sum of all even bits ($x_{2i}$) minus the sum of all odd bits ($x_{2i+1}$) composing X The remaining sum is naturally positive and less than three. The calculation can be implemented either in a dedicated hardware (e.g., adders) or by a software (e.g., executed by a CPU) or by a look-up table (LUT). Addition and subtraction of multiple bits of address are non-trivial on the address decoding path. LUT-based solution requires large storage and multiple step searching. It significantly impacts memory access performance and power consumption. Therefore, it is beneficial to have methods and apparatuses for quick modulo-3 operation in digital electronic systems.

SUMMARY

The following presents a simplified summary of one or more implementations to provide a basic understanding of such implementations. This summary is not an extensive overview of all contemplated implementations, and is intended to neither identify key nor critical elements of all implementations nor delineate the scope of any or all implementations. The sole purpose of the summary is to present concepts relate to one or more implementations in a simplified form as a prelude to a more detailed description that is presented later.

In one aspect, a circuit for modulo-3 operation may comprise an encoder stage coupled to a binary number, wherein the encoder stage comprises one or more encoders, each one of the one or more encoders receives one or two binary bits of the binary number and generates a unary code of encoder; and one or more levels of reduction stage, wherein a first level of the one or more levels of reduction stage comprises one or more mergers of first reduction, each one of the one or more mergers of first reduction receives two unary codes of encoder or a unary code of encoder and a bit from the binary number and generates a unary code of first reduction.

In another aspect, a method comprises providing a binary number; generating one or more unary codes of encoder in an encoder stage, wherein each one or the one or more unary code of encoder is generated from one or two bits of the binary number; and generating one or more unary codes in one or more levels of reduction stage, wherein a unary code generated by a next level of the one or more levels of reduction stage is generated from (1) two unary codes of one or two previous levels of the one or more levels of reduction stage or the encoder stage or (2) a unary code of a previous level of the one or more levels of reduction stage or the encoder stage and a bit from the binary number.

To accomplish the foregoing and related ends, one or more implementations include the features hereinafter fully described and particularly pointed out in the claims. The following description and the annexed drawings set forth in detail certain illustrative aspects of the one or more implementations. These aspects are indicative, however, of a few of the various ways in which the principles of various implementations may be employed and the described implementations are intended to include all such aspects and their equivalents.

DETAILED DESCRIPTION

The detailed description set forth below, in connection with the appended drawings, is intended as a description of various aspects and is not intended to represent the only aspects in which the concepts described herein may be practiced. The detailed description includes specific details for the purpose of providing an understanding of the various concepts. However, it will be apparent to those skilled in the art that these concepts may be practiced without these specific details. In some instances, well-known structures and components are shown in block diagram form in order to avoid obscuring such concepts.

One factor affecting the performance and power consumption of the addition and subtraction is due to calculation and propagation of carries. In accordance with various aspects of the disclosure, direct addition or subtraction, thus carry calculation and propagation, may be eliminated for modulo-3 operation on a memory address through unary encoding and tree reduction.

Assuming X has even number of bits, X (% 3) can be written as $$X\ (\%\ 3) \equiv (x_N - x_{N-1})\ (\%\ 3) + (x_{N-2} - x_{N-3})\ (\%\ 3) + \ldots + (x_1 - x_0)\ (\%\ 3).$$

The equation implies that the modulo-3 operation may be done by tree reduction. First, grouping every two bits (one odd bit and one even bit) and calculate modulo-3 for each group, which reduces the number of bits into half. Applying same method on the half to further reduce the number of bits into one quarter, and so on until we obtain the final remainder.

In order to simplify the logic, in accordance with various aspects of the disclosure, unary one-hot encoding is used. There are many variations of this encoding. In an exemplary embodiment, a unary code [PZN] has three bits, where [PZN]=[100] stands for remainder of 1 (or −2) after modulo-3 operation, [PZN]=[001] stands for remainder of −1 (or +2) after modulo-3 operation, and [PZN]=[010] stands for remainder of 0 after modulo-3 operation. A sample encoding scheme for 2-bit input is shown below:

| Binary Input | Remainder (Modulo-3) | Unary Code [PZN] |
|---|---|---|
| 00 | 0 | 010 |
| 01 | 1 (or −2) | 100 |
| 10 | 2 (or −1) | 001 |
| 11 | 0 | 010 |

The Boolean logic for implementing the above encoding is shown below:

P=~o & e,
Z=o ⊙ e,
N=a & ~e, where ~ stands for logic inversion, & stands for logic AND, and ⊙ stands for logic XNOR.

Figure 1B:
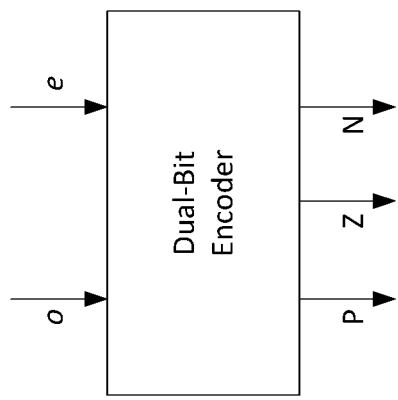
FIG. 1B illustrates an exemplary symbol of the dual-bit encoder according to certain aspects of the present disclosure.
Figure 1A:
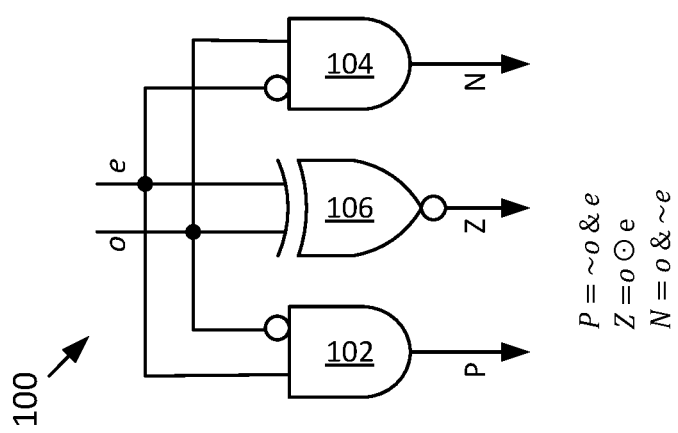
FIG. 1A illustrates an exemplary encoder for two-bit modulo-3 operation according to certain aspects of the present disclosure.

FIG. 1A illustrates an exemplary encoder for two-bit modulo-3 operation according to certain aspects of the present disclosure. The dual-bit encoder 100 is configured to receive an even bite and an odd bit o and generate a unary code [PZN]. The dual-bit encoder 100 receives the two inputs, o and e, where e stands for an even bit and o stands for an odd bit. In accordance with various aspects of the disclosure, in an exemplary embodiment, the dual-bit encoder 100 comprises a two-input logic AND gate 102, a two-input logic AND gate 104, and a two-input logic XNOR gate 106. The logic AND gate 102 receives the input signal o and the inversion of the input signal e. At its output, the logic AND gate 102 generates the code P. Similarly, the logic AND gate 104 receives the input signal e and the inversion of the input signal o. At its output, the logic AND gate 104 generates the code N. The logic XNOR gate 106 receives the input signal o and the input signal e. At its output, the logic XNOR gate 106 generates the code Z. FIG. 1B illustrates an exemplary symbol of the dual-bit encoder 100 according to certain aspects of the present disclosure. The dual-bit encoder receives two inputs, even bit e and odd bit o and generates the unary code [PZN].

In another exemplary embodiment, a sample coding for 1-bit input may be used. For a single even bit, the encoding scheme is similar to 2-bit encoding with odd bit to be logic "0". Thus, the Boolean logic for an even bit modulo-3 encoding is simplified as P=e,
Z=~e,
N=0.

Similarly, for a single odd bit, the encoding scheme is similar to 2-bit encoding with even bit to be logic "0". The Boolean logic for an odd bit modulo-3 encoding is P=0,
Z=~o,
N=o.

Figure 2B:
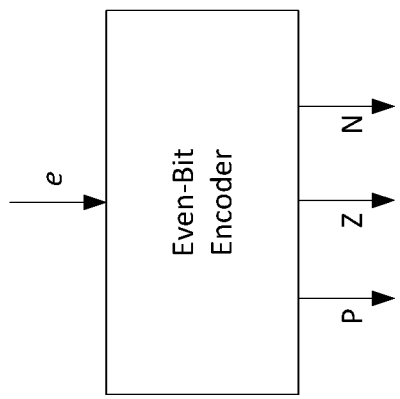
FIG. 2B illustrates an exemplary symbol of the even-bit encoder according to certain aspects of the present disclosure.
Figure 2A:
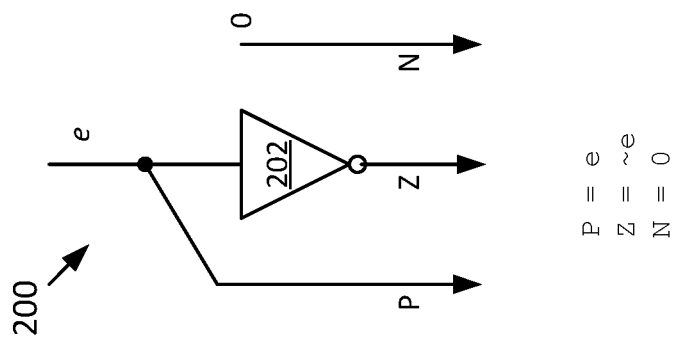
FIG. 2A illustrates an exemplary encoder for even-bit modulo-3 operation according to certain aspects of the present disclosure.

FIG. 2A illustrates an exemplary encoder for even-bit modulo-3 operation according to certain aspects of the present disclosure. The even-bit encoder 200 is configured to receive an even bit e and generate a unary code [PZN]. The even-bit encoder 200 passes the input signal e to the output as the code P and shorts the code N to logic "0". Further, the even-bit encoder 200 negates (through, e.g., an inverter 202) the input signal e to generate the code Z. FIG. 2B illustrates an exemplary symbol of the even-bit encoder 200 according to certain aspects of the present disclosure.

Figure 3B:
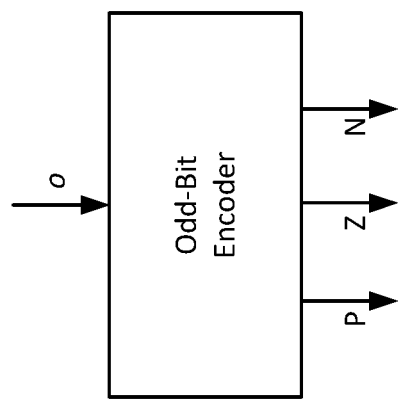
FIG. 3B illustrates an exemplary symbol of the odd-bit encoder according to certain aspects of the present disclosure.
Figure 3A:
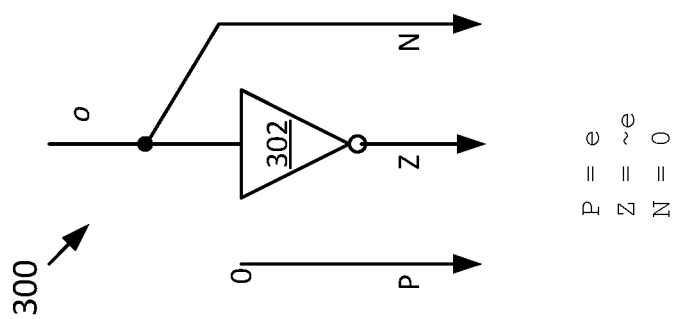
FIG. 3A illustrates an exemplary encoder for odd-bit modulo-3 operation according to certain aspects of the present disclosure.

FIG. 3A illustrates an exemplary encoder for odd-bit modulo-3 operation according to certain aspects of the present disclosure. The odd-bit encoder 200 is configured to receive an odd bit e and generate a unary code [PZN]. The odd-bit encoder 300 passes the input signal o to the output as the code N and shorts the code P to logic "0". Further, the odd-bit encoder 300 negates (through, e.g., an inverter 302) the input signal o to generate the code Z. FIG. 3B illustrates an exemplary symbol of the odd-bit encoder 300 according to certain aspects of the present disclosure.

Assume the unary codes for the output of a first encoder output is [XpXzXn] and the output of a second encoder is [YpYzYn]. The combined remainder for two unary codes of modulo-3 is 1 ([PZN]=100) when one unary code has remainder of 1 and another has remainder of 0 or both unary codes has remainder of −1. The combined remainder for two unary codes of modulo-3 is −1 ([PZN]=001) when one unary code has remainder of −1 and another has remainder of 0 or both unary codes has remainder of 1. The combined remainder for two unary codes of modulo-3 is 0 ([PZN]=010) when one unary code has remainder of 1 and another has remainder of −1 or both unary codes has remainder of 0. Thus, to merge two unary codes, the following Boolean logic may be applied.

P=(Xp & Yz)|(Xz & Yp)|(Xn & Yn),
Z=(Xz & Yz)|(Xn & Yp)|(Xp & Yn),
N=(Xn & Yz)|(Xp & Yp)|(Xz & Yn).

Figure 4B:
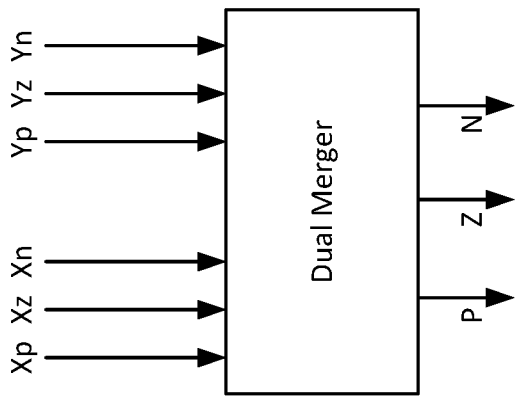
FIG. 4B illustrates an exemplary symbol of the dual merger according to certain aspects of the present disclosure.
Figure 4A:
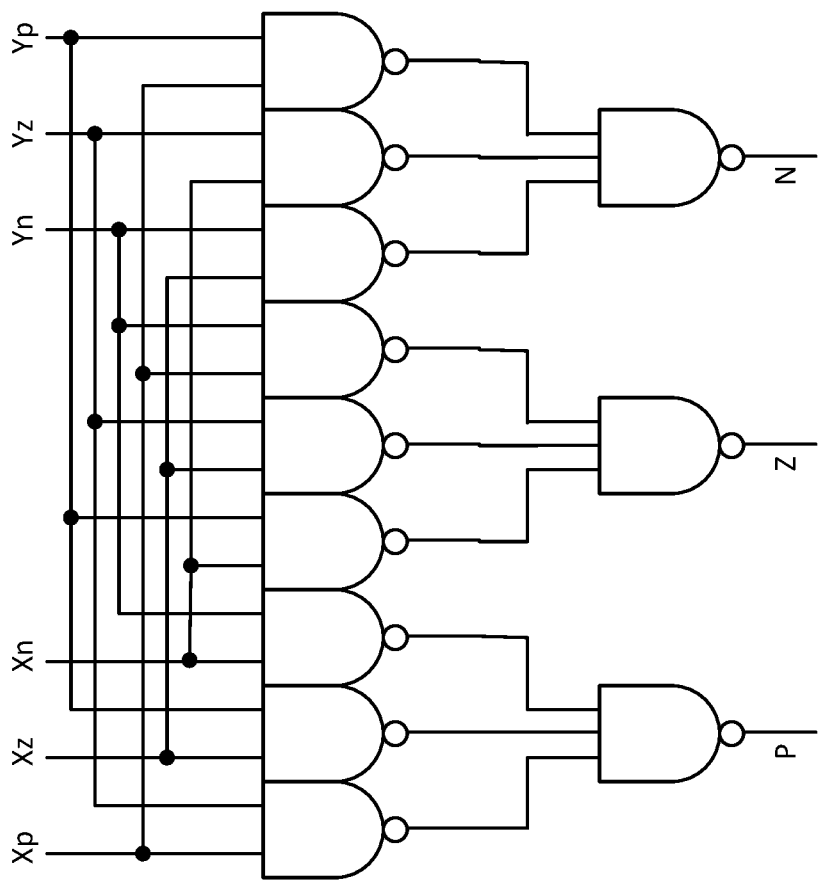
FIG. 4A illustrates an exemplary dual merger for modulo-3 operation according to certain aspects of the present disclosure.

FIG. 4A illustrates an exemplary dual merger for modulo-3 operation according to certain aspects of the present disclosure. The dual merger 400 is configured to receive two unary codes and generate a unary code representing a modulo-3 of the sum of the two unary codes received. In an exemplary embodiment, the dual merger 400 comprises 9 2-input NAND gates at the first stage and 3 3-input NAND gates at the second stage. FIG. 4B illustrates an exemplary symbol of the dual merger 400 according to certain aspects of the present disclosure.

It is possible and sometimes necessary or simpler to merge a unary code with a single bit, either an even or an odd bit directly. To merge a unary code with an even bit, the following Boolean logic may be applied.

P=(~e & XP)|(e & Xz),
Z=(~e & Xz)|(e & Xn),
N=(~e & Xn)|(e & Xp).

Figure 5B:
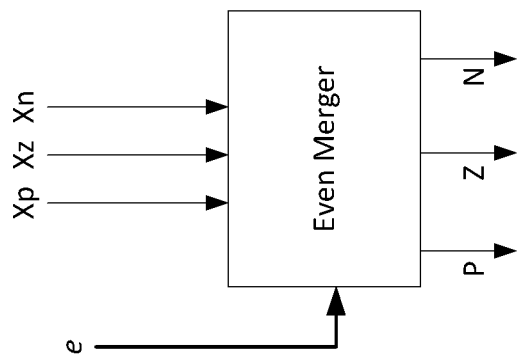
FIG. 5B illustrates an exemplary symbol of the even merger according to certain aspects of the present disclosure.
Figure 5A:
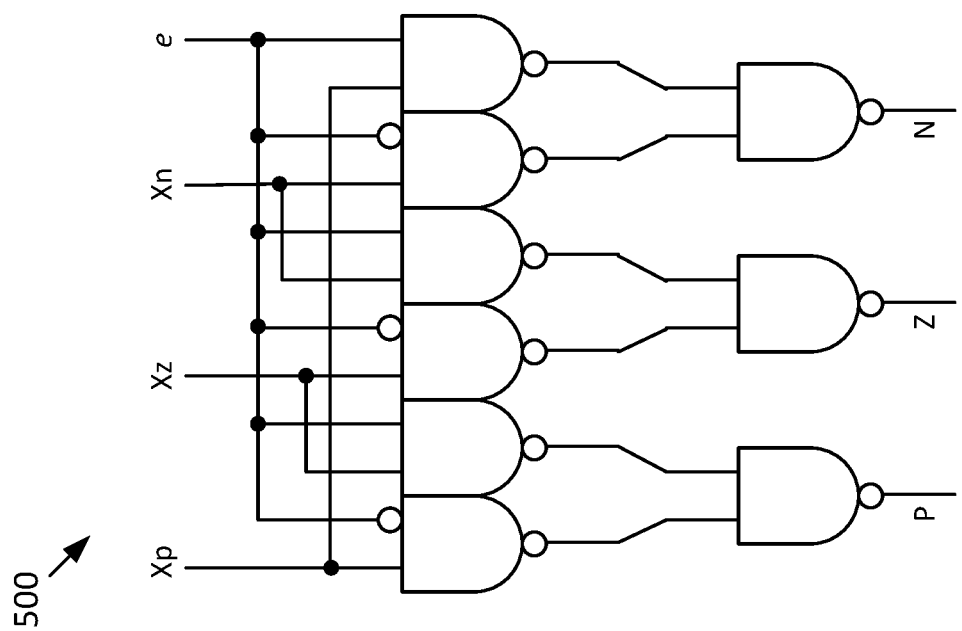
FIG. 5A illustrates an exemplary even merger for modulo-3 operation according to certain aspects of the present disclosure.

FIG. 5A illustrates an exemplary even merger for modulo-3 operation according to certain aspects of the present disclosure. The even merger 500 is configured to receive a unary code and an even bit and generate a unary code representing a modulo-3 of the sum of the unary code and the even bit received. In an exemplary embodiment, the even merger 500 comprises 6 2-input NAND gates at the first stage and 3 2-input NAND gates at the second stage. FIG. 5B illustrates an exemplary symbol of the even merger 500 according to certain aspects of the present disclosure.

Similarly, to merge a unary code with an odd bit, the following Boolean logic may be applied.

P=(~o & Xp)|(o & Xn),
Z=(~o & Xz)|(o & Xp),
N=(~o & Xn)|(o & Xz).

Figure 6B:
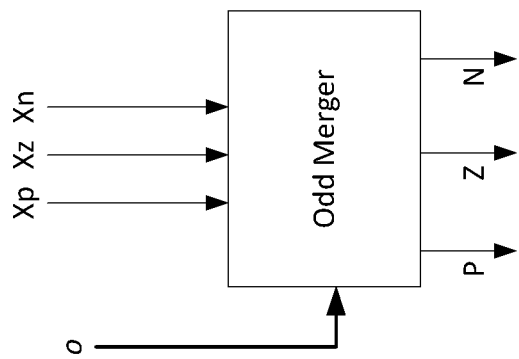
FIG. 6B illustrates an exemplary symbol of the odd merger according to certain aspects of the present disclosure.
Figure 6A:
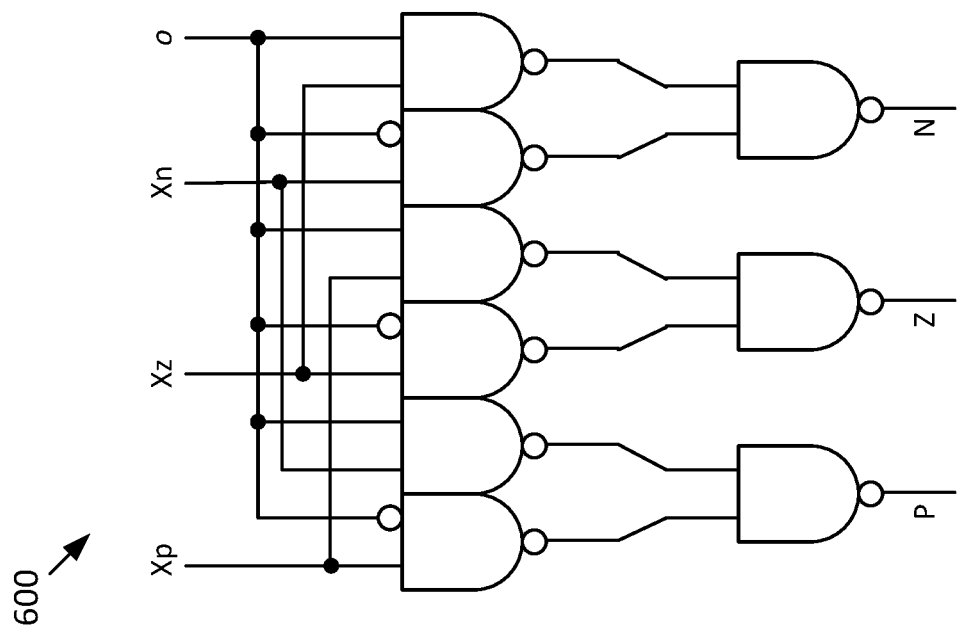
FIG. 6A illustrates an exemplary odd merger for modulo-3 operation according to certain aspects of the present disclosure.

FIG. 6A illustrates an exemplary odd merger for modulo-3 operation according to certain aspects of the present disclosure. The odd merger 600 is configured to receive a unary code and an odd bit and to generate a unary code representing a modulo-3 of the sum of the unary code and the odd bit received. In an exemplary embodiment, the odd merger 600 comprises 6 2-input NAND gates at the first stage and 3 2-input NAND gates at the second stage. FIG. 6B illustrates an exemplary symbol of the odd merger 600 according to certain aspects of the present disclosure.

With the various encoders (e.g., dual encoder, even encoder, and odd encoder) and various mergers (e.g., dual merger, even merger, and odd merger), a binary number with a plurality of bits may be divided into a plurality of groups, each one of the plurality groups may contain 2 bits or 1 bit. Each one of the plurality groups may be encoded with a dual encoder, an even encoder, or an odd encoder, depending if the group contains two bits or 1 bit, and if it is 1 bit, if it is an odd bit or an even bit. Further, in a certain embodiment, for a 1-bit group, no encoding may be needed. Instead, the bit may be passed directly to an even merger if it is an even bit or an odd merger if it is an odd bit.

Assuming the binary number has n bits. After it is divided into a plurality of groups, assuming m groups. The number of groups, m, would be around half of n.

$$m \approx \frac{n}{2}.$$

Applying the various mergers (e.g., dual merger, even merger, and odd merger) for every two groups, the plurality of groups will be further reduced to a number k subgroups, where k would be around half of m.

$$k \approx \frac{m}{2}.$$

The reason that k is not always half of m is because the plurality of groups m may not necessary be an even number and there may be groups that do not merger with any other groups.

Figure 7:
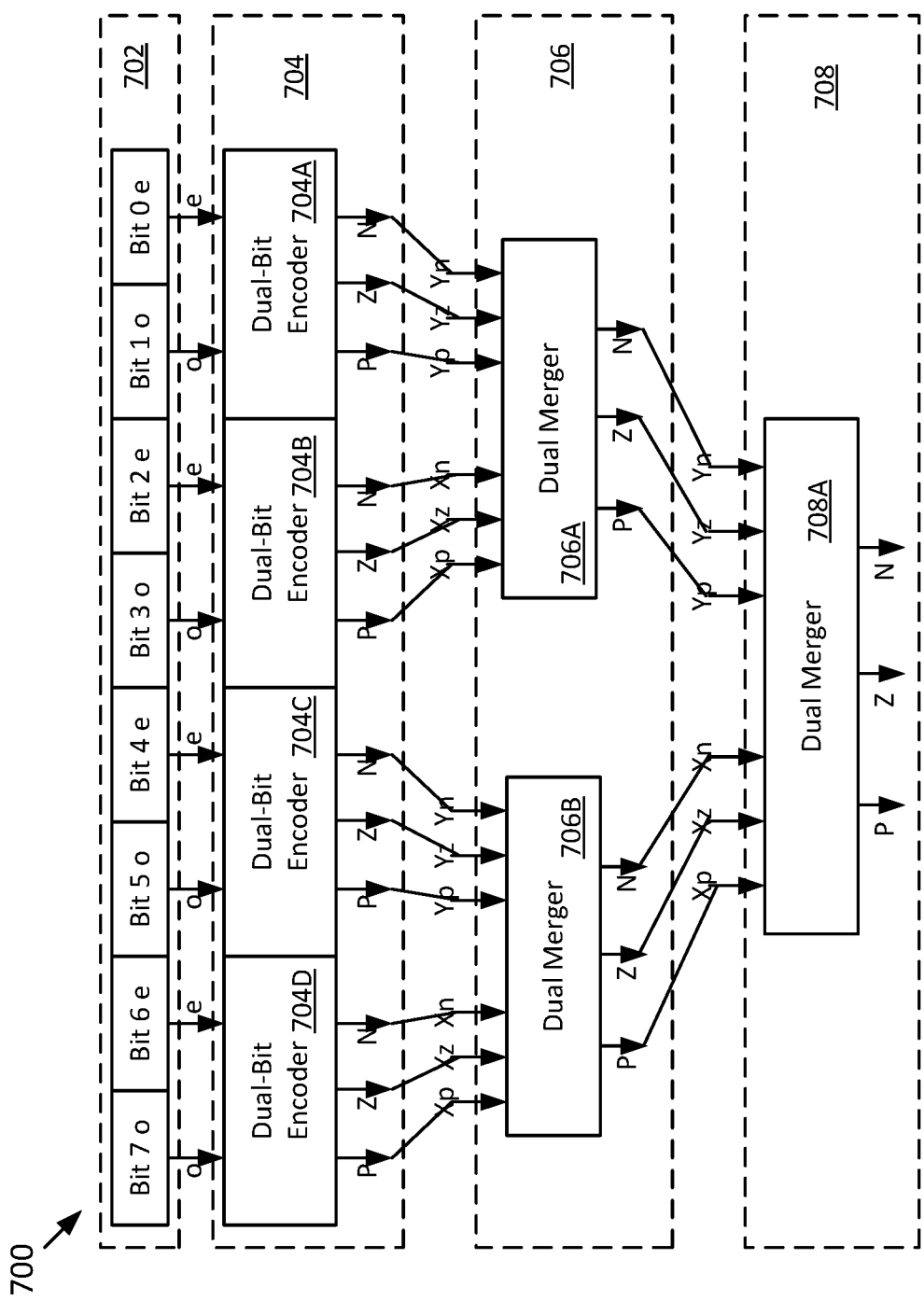
FIG. 7 illustrates an exemplary circuit for modulo-3 of an 8-bit binary number according to certain aspects of the present disclosure.

Apply the various mergers again on the k subgroups and so on until there is a final remainder of modulo-3. Therefore, it would take around $\log_2 n$ levels in tree reduction. FIG. 7 illustrates an exemplary circuit for modulo-3 of an 8-bit binary number according to certain aspects of the present disclosure. For a binary number with different bit counts, similar scheme applies. The circuit 700 received a binary number 702. For illustration purpose only, the binary number 702 is set to be an 8-bit binary number. The binary number 702 could be part of a memory address. From right to left, from LSB to MSB, bit 0, bit 2, bit 4, and bit 6 are even bits, while bit 1, bit 3, bit 5, and bit 7 are odd bits. The binary number 702 could be in a storage element, such as flip-flops, SRAMs, registers, etc. or it could be derived from an output from another processing unit.

The circuit 700 comprises an encoder stage 704 coupled to the binary number 702. The encoder stage 704 comprises one or more encoders 704A-704D. Each one of the one or more encoders 704A-704D receives one or two binary bits of the binary number 702 and generates a unary code of encoder. The unary code of encoder is a unary code representing the modulo-3 operation of the one or two binary bits received. In the exemplary embodiment of the circuit 700, the one or more encoders 704A-704D are dual-bit encoders that receive the inputs from the binary number 702 and encode the bits. The dual-bit encoder 704A receives bit 0 as even-bit input and bit 1 as odd-bit input; the dual-bit encoder 704B receives bit 2 as even-bit input and bit 3 as odd-bit input; the dual-bit encoder 704C receives bit 4 as even-bit input and bit 5 as odd-bit input; and the dual-bit encoder 704D receives bit 6 as even-bit input and bit 7 as odd-bit input. The first reduction stage 704 reduces 8-bit binary number to 4 unary codes.

The circuit 700 further comprises one or more levels of reduction stage 706, 708. A first level of the one or more levels of reduction stage 706 receives the inputs from the outputs of the encoder stage 704 or the binary number 702. The first level of the one or more levels of reduction stage 706 comprises one or more mergers of first reduction 706A-706B. Each one of the one or more mergers of first reduction 706A-706B may receive two unary codes of encoder or a unary code of encoder and a bit from the binary number 702 and generates a unary code of first reduction. The unary code of first reduction is a unary code representing the modulo-3 operation of the unary codes or bit received. In the exemplary embodiment of the circuit 700, the one or more mergers of first reduction are two dual mergers 706A and 706B. The dual merger 706A receives the outputs from the dual-bit encoder 704A and the dual-bit encoder 704B and merges them to generate a new unary code, a unary code of first reduction; the dual merger 706B receives the outputs from the dual-bit encoder 704C and the dual-bit encoder 704D and merges them to generate a new unary code, a unary code of first reduction. The first level of the one or more reduction stage 706 reduces 4 unary codes to 2.

A next level of the one or more levels of reduction stage, e.g., 708, comprises one or more mergers of next reduction, each one of the one or more mergers of next reduction receives two unary codes from one or two previous levels of the one or more levels of reduction stage, e.g., 706 or the encoder stage 704 and generates a unary code of next reduction. The unary code of next reduction is a unary code representing the modulo-3 operation of the two unary codes received. In the exemplary embodiment of the circuit 700, The next level of the one or more levels of reduction stage 708 receives the inputs from the outputs of the first level of the one or more reduction stage 706. The next level of the one or more levels of reduction stage 708 comprises 1 dual merger 708A. The dual merger 708A receives the outputs from the dual merger 706A and the dual merger 706B and merges them to generate a new unary code of next reduction. The term "next level" is relative to the term "previous level." For example, if level B receives inputs from the outputs of level A, then level A is a previous level while level B is a next level. But level B could become a previous level to level C if level C receives input from the output of level B.

In the exemplary embodiment of the circuit 700, The next level of the one or more levels of reduction stage 708 is also the last level of the one or more levels of reduction stage. The unary code output by the dual merger 708A is thus the remainder of the binary number 702 with modulo-3 operation.

If there are more than 8 bit, such as 16 bits or 32 bits, then more levels of reduction stage are needed until there is only one unary code. In the case of 8-bit binary number, there are about 60 equivalent 2-input NAND gates in the exemplary design. The final remainder is obtained with 5-gate delay. That is significant faster than a circuit that requires calculating and passing carries.

Figure 8:
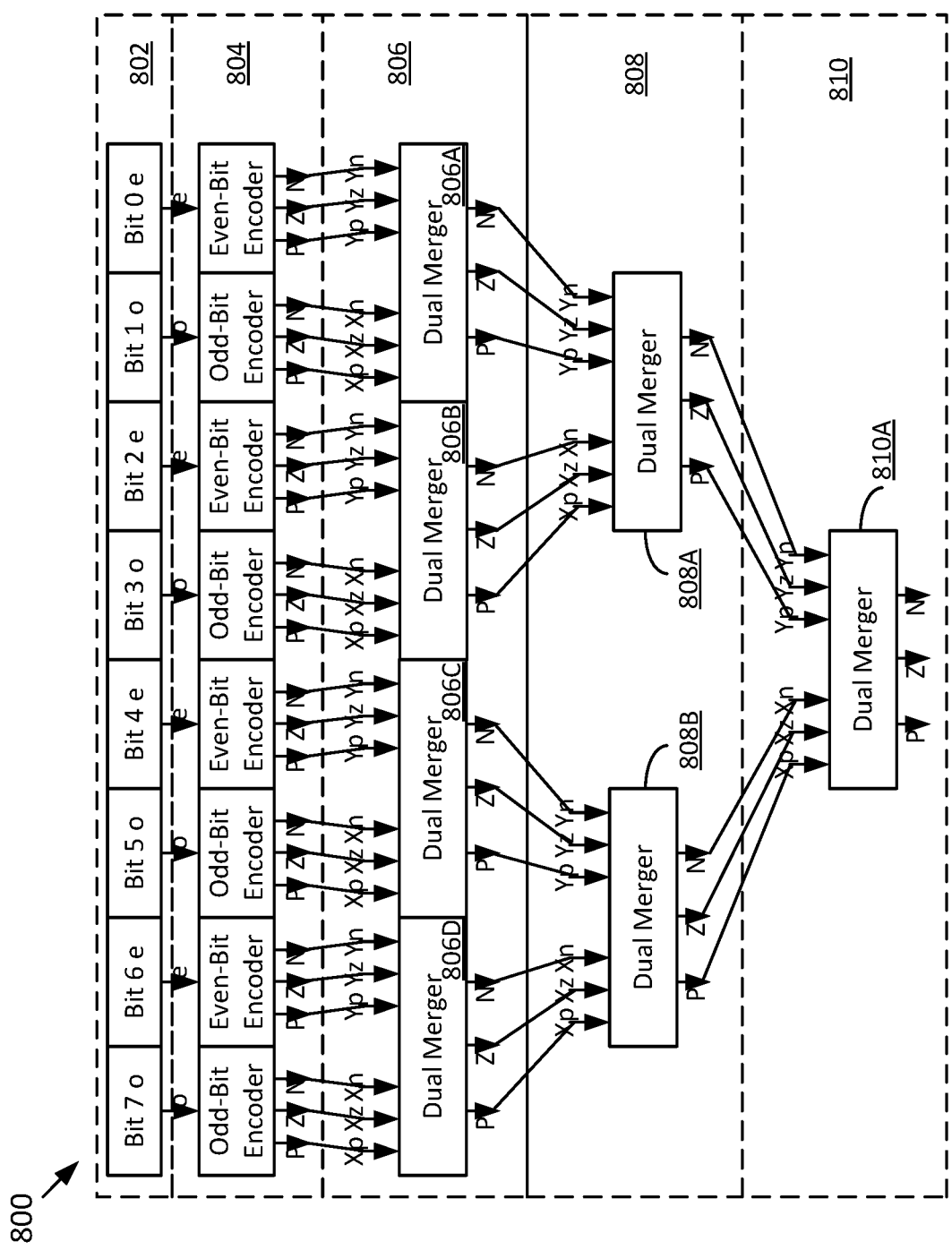
FIG. 8 illustrates another exemplary circuit for modulo-3 of an 8-bit binary number according to certain aspects of the present disclosure.

FIG. 8 illustrates another exemplary circuit for modulo-3 of an 8-bit binary number. For a binary number with different bit counts, similar scheme applies. Like the circuit 700, the circuit 800 received a binary number 802. The binary number 802, for illustration purpose, is an 8-bit binary number. The binary number 802 could be part of a memory address. From right to left, from LSB to MSB, bit 0, bit 2, bit 4, and bit 6 are even bits, while bit 1, bit 3, bit 5, and bit 7 are odd bits. The binary number 802 could be in a storage element, such as flip-flops, SRAMs, registers, etc. or it could be derived from an output from another processing unit.

Unlike the circuit 700, the circuit 800 comprises 8 encoders at the encoder stage 804. The encoder stage 804 comprises one or more encoders, e.g., 8 encoders, in the exemplary embodiment of the circuit 800. Each one of the 8 encoder takes one bit from the binary number 802 and generates a unary code of encoder [PZN]. For example, an even-bit encoder for each even bit, bit 0, bit 2, bit 4, and bit 6 and an odd-bit encoder for each odd bit, bit 1, bit 3, bit 5, and bit 7. As a result, no actual reduction happens at the encoder stage 804. There are 8 unary codes of encoder generated by the encoder stage 804, corresponding to 8 bits in the binary number. The unary code of encoder is a unary code representing the modulo-3 operation of the one or two binary bits received.

The circuit 800 further comprises one or more levels of reduction stage 806, 808, 810. A first level of the one or more levels of reduction stage 806 receives the inputs from the outputs of the encoder stage 804 or the binary number 802. The first level of the one or more levels of reduction stage 806 comprises one or more mergers of first reduction 806A-806D. Each one of the one or more mergers of first reduction 806A-806D may receive two unary codes of encoder or a unary code of encoder and a bit from the binary number 802 and generates a unary code of first reduction. The unary code of first reduction is a unary code representing the modulo-3 operation of the unary codes or bit received. In the exemplary embodiment of the circuit 800, the one or more mergers of first reduction are four dual mergers 806A-806D. The dual merger 806A receives the outputs from the even-bit encoder for bit 0 and the odd-bit encoder for bit 1 and merges them to generate a new unary code of first reduction; The dual merger 806B receives the outputs from the even-bit encoder for bit 2 and the odd-bit encoder for bit 3 and merges them to generate a new unary code of first reduction; The dual merger 806C receives the outputs from the even-bit encoder for bit 4 and the odd-bit encoder for bit 5 and merges them to generate a new unary code of first reduction; and the dual merger 806D receives the outputs from the even-bit encoder for bit 6 and the odd-bit encoder for bit 7 and merges them to generate a new unary code of first reduction. The first level of the one or more levels of reduction stage 806 reduces the number of unary codes by half to 4.

A next level of the one or more levels of reduction stage, e.g., 808 or 810, comprises one or more mergers of next reduction, each one of the one or more mergers of next reduction receives two unary codes from one or two previous levels of the one or more levels of reduction stage, e.g., 806 or 808 or the encoder stage 804 and generates a unary code of next reduction. The unary code of next reduction is a unary code representing the modulo-3 operation of the two unary codes received. For example, in the exemplary embodiment of the circuit 800, The next level of the one or more levels of reduction stage 808 receives the inputs from the outputs of the first level of the one or more reduction stage 806. The next level of the one or more levels of reduction stage 808 comprises 2 dual mergers 808A-808B. The dual merger 808A receives the outputs of the dual-bit encoder 806A and the dual-bit encoder 806B and merges them to generate a new unary code of next reduction; the dual merger 808B receives the outputs of the dual-bit encoder 806C and the dual-bit encoder 806D and merges them to generate a new unary code of next reduction. The term "next level" is relative to the term "previous level." For example, if level B receives inputs from the outputs of level A, then level A is a previous level while level B is a next level. But level B could become a previous level to level C if level C receives input from the output of level B.

In the exemplary embodiment of the circuit 800, the next level of the one or more levels of reduction stage 810 is the last level of the one or more levels of reduction stage. The last level of the one or more levels of reduction stage 810 comprises a merger 810A receiving the inputs from the outputs of the previous levels of the one or more levels of reduction stage 808. In the present embodiment, the merger 810A is a dual merger. The dual merger 810A receives the outputs from the dual merger 808A and the dual merger 808B and merges them to generate a new unary code. The unary code output by the dual merger 810A is thus the remainder of the binary number 802 with modulo-3 operation.

If there are more than 8 bit, such as 16 bits or 32 bits, then more levels of reduction stage are needed until there is only one unary code. For the circuit 800, in the case of 8-bit binary number, there are about 80 equivalent 2-input NAND gates in the exemplary design. The final remainder is obtained with 7-gate delay.

Figure 9:
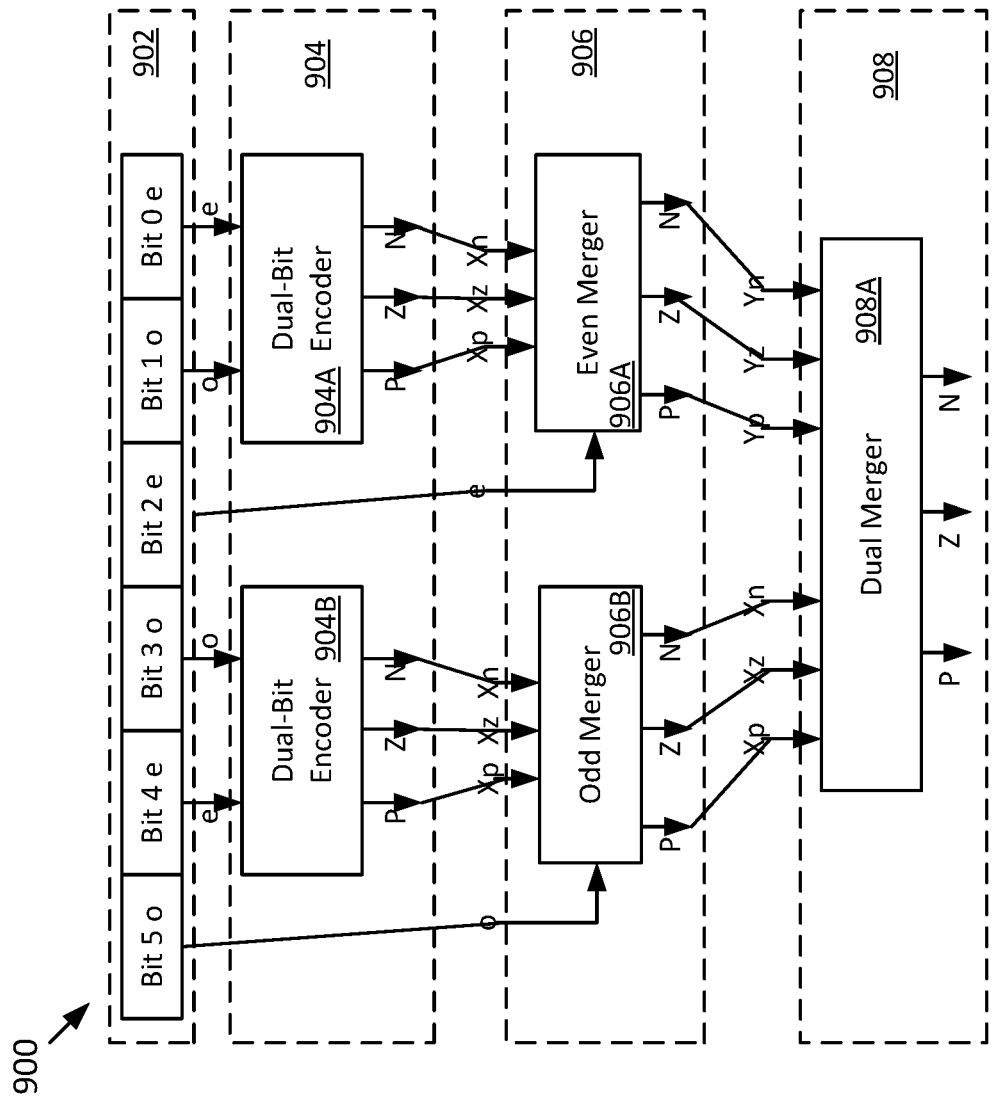
FIG. 9 illustrates an exemplary circuit for modulo-3 of a 6-bit binary number according to certain aspects of the present disclosure.

If the number of bits n in a binary number cannot be written as $2^k$, where k is a positive integer, then it may not be possible to pair up every unary code or every even bit with an odd bit. Some unary codes and some bits may have to pass over directly to next level of reduction stage. FIG. 9 illustrates an exemplary circuit for modulo-3 of a 6-bit binary number according to certain aspects of the present disclosure. For a binary number with different bit counts, similar scheme applies. The circuit 900 receives a binary number 902. The binary number 902, for illustration purpose, is a 6-bit binary number. The binary number 902 could be part of a memory address. From right to left, from LSB to MSB, bit 0, bit 2, and bit 4 are even bits, while bit 1, bit 3, and bit 5 are odd bits. The binary number 902 could be in a storage element, such as flip-flops, SRAMs, registers, etc. or it could be derived from an output from another processing unit.

The circuit 900 comprises an encoder stage 904. The encoder stage 904 comprises one or more encoders 904A-904B that receives the inputs from the binary number 902 and encodes the bits to generate unary codes of encoder. The unary code of encoder is a unary code representing the modulo-3 operation of the one or two binary bits received. In the exemplary embodiment of the circuit 900, the one or more encoders 904A-904B are dual-bit encoders. However, only bit 0 and bit 1 pair and bit 3 and bit 4 pair are encoded. The dual-bit encoder 904A receives bit 0 as even-bit input and bit 1 as odd-bit input; and the dual-bit encoder 904B receives bit 4 as even-bit input and bit 3 as odd-bit input. Bit 2 and bit 5 pass directly to next stage 906.

The circuit 900 further comprises one or more levels of reduction stage 906, 908. A first level of the one or more levels of reduction stage 906 receives the inputs from the outputs of the encoder stage 904 or the binary number 902. The first level of the one or more levels of reduction stage 906 comprises one or more mergers of first reduction 906A-906B. Each one of the one or more mergers of first reduction 906A-906B may receive two unary codes of encoder or a unary code of encoder and a bit from the binary number 902 and generates a unary code of first reduction. The unary code of first reduction is a unary code representing the modulo-3 operation of the unary codes or bit received. In the exemplary embodiment of the circuit 900, the one or more mergers of first reduction are an even merger 906A and an odd merger 906B. The first level of the one or more levels of reduction stage 906 receives the inputs from the outputs of the encoder stage 904 and Bits 2 and 5 from the binary number 902. The even merger 906A receives the outputs from the dual-bit encoder 904A and bit 2 from the binary number 902 and merges them to generate a new unary code of first reduction; the odd merger 906B receives the outputs from the dual-bit encoder 904B and bit 5 from the binary number 902 and merges them to generate a new unary code of first reduction. The first level of the one or more levels of reduction stage 906 generates 2 unary codes of first reduction.

A next level of the one or more levels of reduction stage, e.g., 908, comprises one or more mergers of next reduction, each one of the one or more mergers of next reduction receives two unary codes from one or two previous levels of the one or more levels of reduction stage, e.g., 906 or the encoder stage 904 and generates a unary code of next reduction. In the exemplary embodiment of the circuit 900, The next level of the one or more levels of reduction stage 908 receives the inputs from the outputs of the first level of the one or more reduction stage 906. The next level of the one or more levels of reduction stage 908 comprises 1 dual merger 908A. The dual merger 908A receives the outputs from the even merger 906A and the odd merger 906B and merges them to generate a new unary code of next reduction. Note, the term "next level" is relative to the term "previous level." For example, if level B receives inputs from the outputs of level A, then level A is a previous level to level B while level B is a next level to level A. But level B could become a previous level to level C if level C receives input from the output of level B.

In the exemplary embodiment of the circuit 900, The next level of the one or more levels of reduction stage 908 is also the last level of the one or more levels of reduction stage. The unary code output by the dual merger 908A is thus the remainder of the binary number 902 with modulo-3 operation. There are about 40 equivalent 2-input NAND gates in the circuit 900 in the exemplary design. The final remainder is obtained with 5-gate delay. That is significantly faster than a circuit that requires calculating and passing carries or LUT-based solution.

Figure 10:
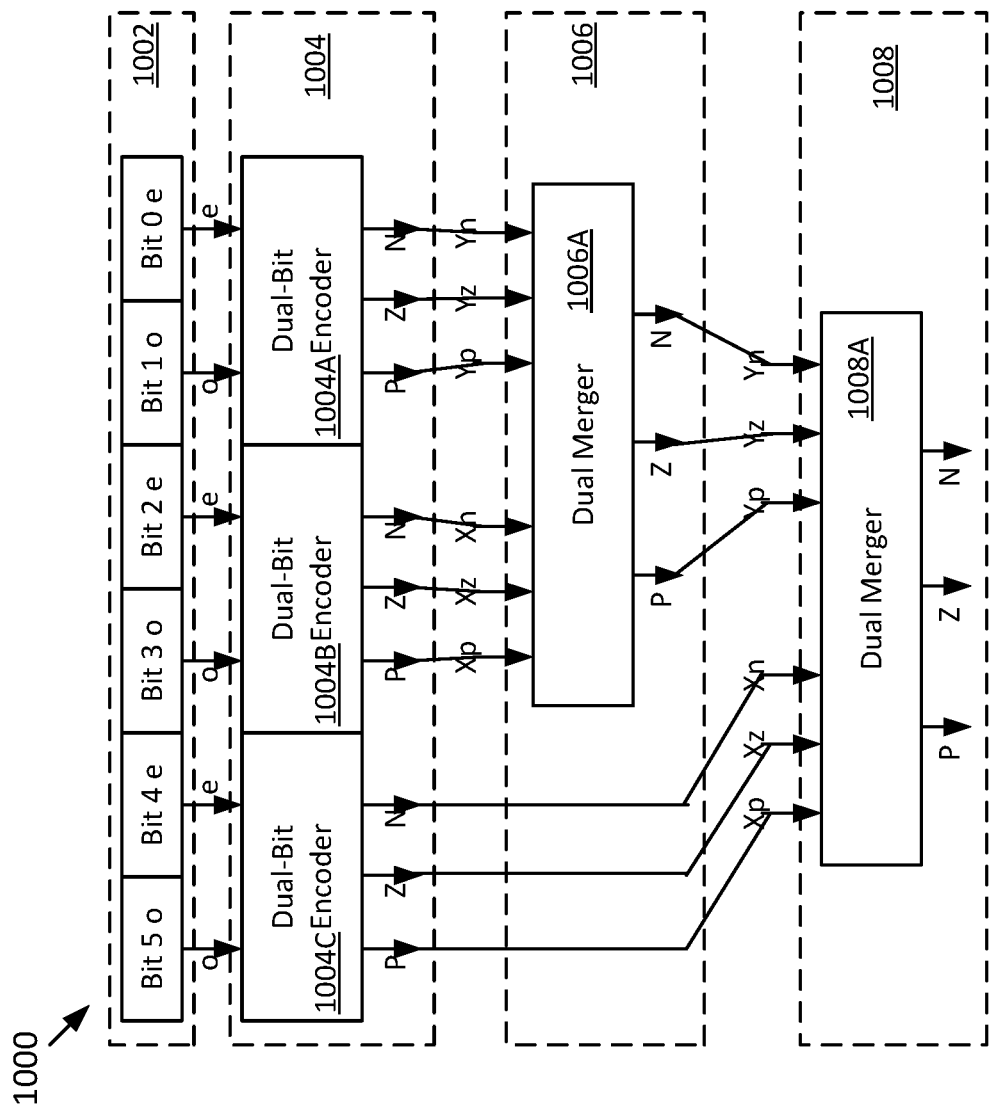
FIG. 10 illustrates another exemplary circuit for modulo-3 of a 6-bit binary number according to certain aspects of the present disclosure.

FIG. 10 illustrates another exemplary circuit for modulo-3 of a 6-bit binary number according to certain aspects of the present disclosure. For a binary number with different bit counts, similar scheme applies. Like the circuit 900, the circuit 1000 receives a binary number 1002. The binary number 1002, for illustration purpose, is a 6-bit binary number. The binary number could be part of a memory address. From right to left, from LSB to MSB, bit 0, bit 2, and bit 4 are even bits, while bit 1, bit 3, and bit 5 are odd bits. The binary number 1002 could be in a storage element, such as flip-flops, SRAMs, registers, etc. or it could be derived from an output from another processing unit.

The circuit 1000 comprises an encoder stage 1004. The encoder stage 1004 comprises one or more encoders 1004A-1004C that receives the inputs from the binary number 1002 and encodes the bits to generate unary codes of encoder. The unary code of encoder is a unary code representing the modulo-3 operation of the one or two binary bits received. In the exemplary embodiment of the circuit 1000, the one or more encoders 1004A-1004C are dual-bit encoders. The dual-bit encoder 1004A receives bit 0 as even-bit input and bit 1 as odd-bit input; the dual-bit encoder 1004B receives bit 2 as even-bit input and bit 3 as odd-bit input; and the dual-bit encoder 1004C receives bit 4 as even-bit input and bit 5 as odd-bit input. The encoder stage 1004 reduces the 6-bit binary number into 3 unary codes of encoder.

The circuit 1000 further comprises one or more levels of reduction stage 1006, 1008. The first level of the one or more levels of reduction stage 1006 receives the inputs from the outputs of the encoder stage 1004 or the binary number 1002. The first level of the one or more levels of reduction stage 1006 comprises one or more mergers of first reduction 1006A. Each one of the one or more mergers of first reduction 1006A may receive two unary codes of encoder or a unary code of encoder and a bit from the binary number 1002 and generates a unary code of first reduction. The unary code of first reduction is a unary code representing the modulo-3 operation of the unary codes or bit received. In the exemplary embodiment of the circuit 1000, the one or more mergers of first reduction is a dual merger 1006A. The dual merger 1006A receives the outputs from the dual-bit encoder 1004A and the dual-bit encoder 1004B and merges them to generate a unary code of first reduction; The unary code output of the dual-encoder 1004C passes directly to the next level of reduction stage. Note, the term "next level" is relative to the term "previous level." For example, if level B receives inputs from the outputs of level A, then level A is a previous level while level B is a next level. But level B could become a previous level to level C if level C receives input from the output of level B.

A next level of the one or more levels of reduction stage, e.g., 1008, comprises one or more mergers of next reduction, each one of the one or more mergers of next reduction receives two unary codes from one or two previous levels of the one or more levels of reduction stage, e.g., 1006 or the encoder stage 1004 and generates a unary code of next reduction. The unary code of next reduction is a unary code representing the modulo-3 operation of the two unary codes received. In the exemplary embodiment of the circuit 1000, the next level of the one or more levels of reduction stage 1008 is the last level of the one or more levels of reduction stage. The last level of the one or more levels of reduction stage 1008 comprises a merger 1008A receiving the inputs from the outputs of the previous levels of the one or more levels of reduction stage 1006 and the dual-bit encoder 1004C. In the exemplary embodiment, the merger 1008A is a dual merger. The dual merger 1008A receives the outputs from the dual merger 1006A and the dual-bit encoder 1004C and merges them to generate a unary code of next reduction. Since this is the last level of the one or more levels of reduction stage, the unary code output by the dual merger 1008A is thus the remainder of the binary number in the binary number 1002 with modulo-3 operation. There are about 53 equivalent 2-input NAND gates in the circuit 1000 in the exemplary design. The final remainder is obtained with 6-gate delay.

Figure 11:
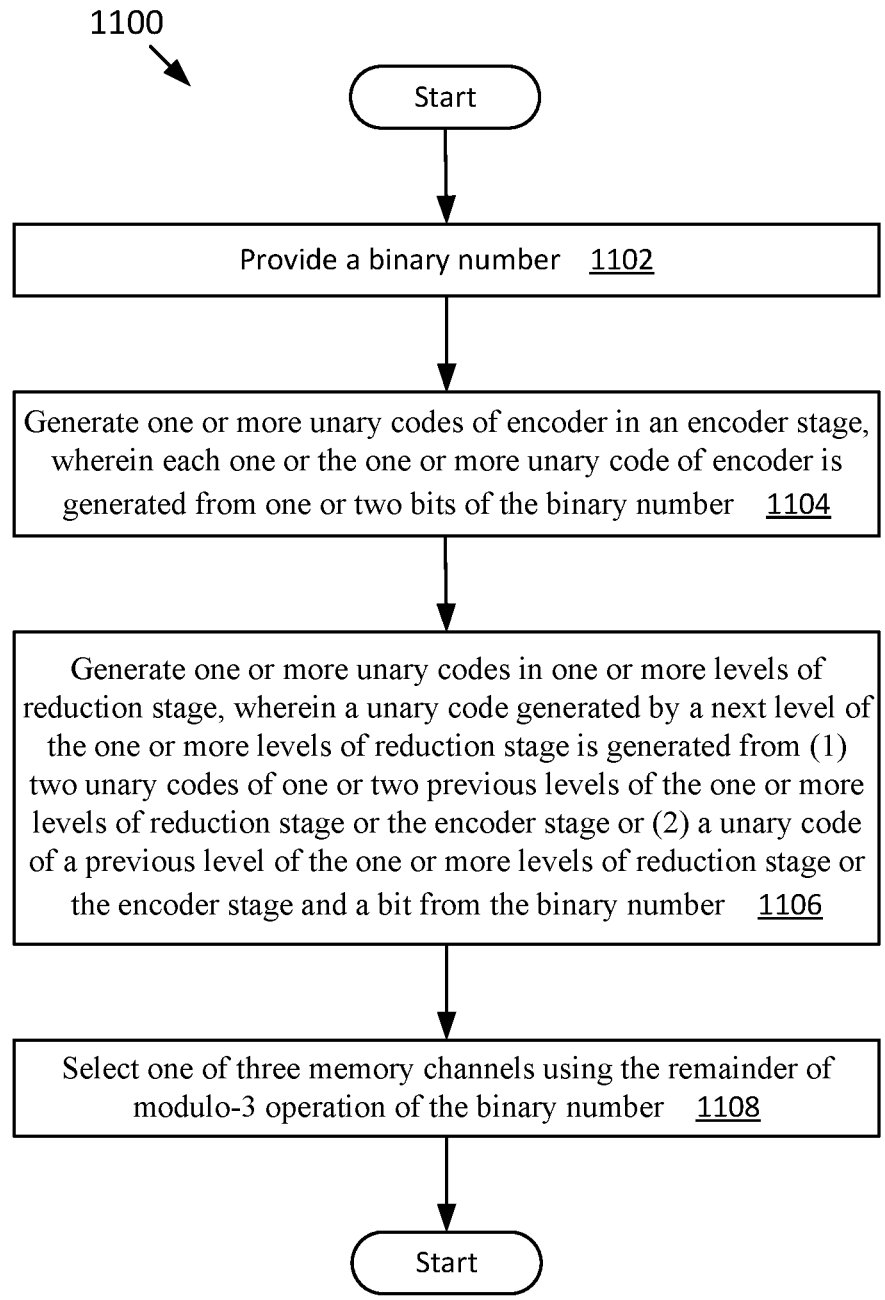
FIG. 11 illustrates an exemplary method for calculating modulo-3 of a binary number according to certain aspects of the present disclosure.

FIG. 11 illustrates an exemplary method 1100 calculating modulo-3 for a binary number according to certain aspects of the present disclosure. At 1102, a binary number is provided (e.g., the binary number 702, 802, 902, or 1002). The binary number could be part of a memory address and could reside in a storage element. At 1104, one or more unary codes of encoder are generated in an encoder stage (e.g., the encoder stage 704, 804, 904, or 1004). Each one of the one or more unary codes of encoder is generated from one or two bits of the binary number. The unary codes are in the format of [PZN], where p=1 stands for remainder of 1 (or −2 if one allows negative numbers in one's modulo field) after modulo-3 operation, n=1 stands for remainder of +2 (or −1 if one allows negative numbers in one's modulo field) after modulo-3 operation, and z=1 stands for remainder of 0 after modulo-3 operation. A sample encoding for 2-bit input is shown below:

| Binary Input | Remainder (Modulo-3) | Unary Code [PZN] |
|---|---|---|
| 00 | 0 | 010 |
| 01 | 1 (or −2) | 100 |
| 10 | 2 (or −1) | 001 |
| 11 | 0 | 010 |

At 1106, the method 1100 generates one or more unary codes in one or more levels of reduction stage (e.g., the one or more levels of reduction stage 706-708, 806-810, 906-908, or 1006-1008), wherein a unary code generated by a next level of the one or more levels of reduction stage is generated from (1) two unary codes of one or two previous levels of one or more levels of reduction stage or the encoder stage or (2) a unary code of a previous level of one or more levels of reduction stage or the encoder stage and a bit from the binary number. The unary code generated by the last level of the one or more levels of reduction stage is a remainder of modulo-3 operation of the binary number.

At 1108, the method 1100 selects one of three memory channels using the remainder of modulo-3 operation of the binary number.

Figure 12:
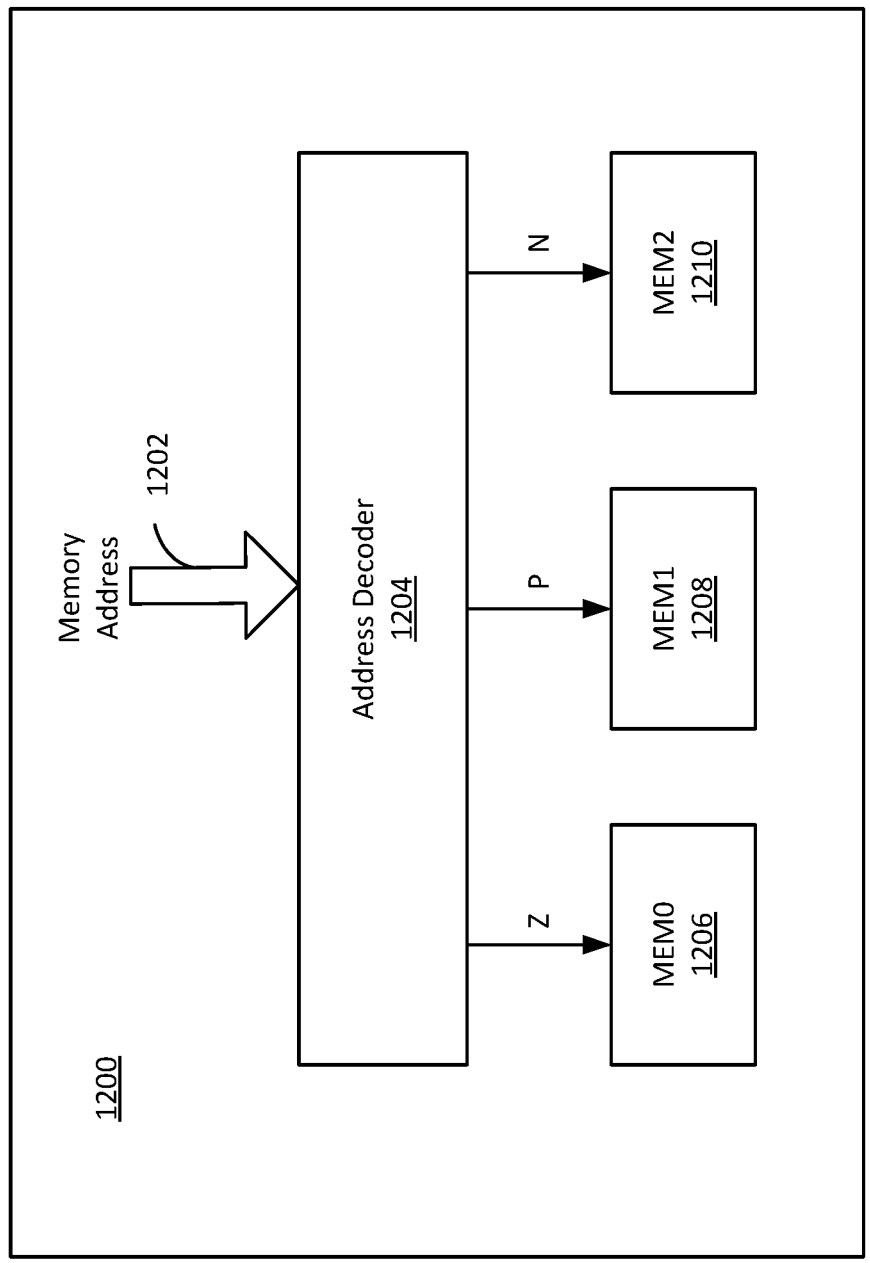
FIG. 12 illustrates an exemplary memory system according to certain aspects of the present disclosure.

FIG. 12 illustrates an exemplary memory system according to certain aspects of the present disclosure. The system 1200 comprises an address decoder 1204 receiving a memory address 1202, which is a binary number. The system 1200 further comprises three memory channels. Each one of the three memory channels correspond to a memory group, MEM0 1206, MEM1 1208, or MEM2 1210. The three memory groups may be three memory banks or three memory systems. The address decoder 1204 decodes the memory address 1202 and determines which memory channel, MEM0 1206, MEM1 1208, and MEM2 1210, is selected. The selection signal [PZN] is a unary code generated by the address decoder 1204. The address decoder 1204 performs modulo-3 operation on the memory address 1202. The address decoder 1204 could be one of the circuits 700, 800, 900, or 1000.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A circuit for modulo-3 operation, comprising:
   an encoder stage coupled to a binary number, wherein the encoder stage comprises one or more encoders, each one of the one or more encoders receives one or two binary bits of the binary number and generates a unary code of encoder; and
   one or more levels of reduction stage, wherein a first level of the one or more levels of reduction stage comprises one or more mergers of first reduction, each one of the one or more mergers of first reduction is configured to receive two unary codes of encoder or a unary code of encoder and a bit from the binary number and generates a unary code of first reduction.

2. The circuit of claim 1, wherein a next level of the one or more levels of reduction stage comprises one or more mergers of next reduction, each one of the one or more mergers of next reduction receives two unary codes from one or two previous levels of the one or more levels of reduction stage or the encoder stage and generates a unary code of next reduction.

3. The circuit of claim 2, wherein the unary code of next reduction generated by each one of the one or more mergers of next reduction represents a modulo-3 of the two unary codes received by the each one of the one or more mergers of next reduction.

4. The circuit of claim 2, wherein a last level of the one or more levels of reduction stage generates a unary code that is a modulo-3 of the binary number.

5. The circuit of claim 4 further comprising three memory channels, wherein the unary code generated by the last level of the one or more levels of reduction stage is configured to select one of the three memory channels.

6. The circuit of claim 5, wherein each one of the three memory channels corresponds to a memory group.

7. The circuit of claim 1, wherein the one or more mergers of first reduction comprises a dual merger configured to receive two unary codes and generate a unary code representing a modulo-3 of a sum of the two unary codes received.

8. The circuit of claim 1, wherein the one or more mergers of first reduction comprises an odd merger configured to receive an unary code and an odd bit of the binary number and generate a unary code representing a modulo-3 of a sum of the unary code and the odd bit received.

9. The circuit of claim 1, wherein the one or more mergers of first reduction comprises an even merger configured to receive an unary code and an even bit of the binary number and generate an unary code representing a modulo-3 of a sum of the unary code and the even bit received.

10. The circuit of claim 1, the unary code of encoder generated by each one of the one or more encoders represents a modulo-3 of one or two bits received.

11. The circuit of claim 10, wherein the unary code of encoder comprises three bits [PZN] and is generated according to following encoding scheme:

| Binary Input | Remainder (Modulo-3) | Unary Code [PZN] |
|---|---|---|
| 00 | 0 | 010 |
| 01 | 1 (or −2) | 100 |
| 10 | 2 (or −1) | 001 |
| 11 | 0 | 010. |

12. The circuit of claim 1, wherein the one or more encoders comprises a dual-bit encoder configured to receive an even bit and an odd bit and generate a unary code of the even bit and the odd bit received.

13. The circuit of claim 1, wherein the one or more encoders comprises an even-bit encoder configured to receive an even bit and generate a unary code of the even bit received.

14. The circuit of claim 1, wherein the one or more encoders comprises an odd-bit encoder configured to receive an odd bit and generate a unary code of the odd bit received.

15. The circuit of claim 1, wherein the binary number is part of a memory address.

16. A method, comprising:
providing a binary number;
generating one or more unary codes of encoder in an encoder stage, wherein each one or the one or more unary codes of encoder is generated from one or two bits of the binary number; and
generating one or more unary codes in one or more levels of reduction stage, wherein a unary code generated by a next level of the one or more levels of reduction stage is generated from (1) two unary codes of one or two previous levels of the one or more levels of reduction stage or the encoder stage or (2) a unary code of a previous level of the one or more levels of reduction stage or the encoder stage and a bit from the binary number.

17. The method of claim 16 wherein the unary code generated by the next level of the one or more levels of reduction stage represents modulo-3 of the two unary codes that are generated by one or two previous levels of the one or more levels of reduction stage.

18. The method of claim 16, wherein a unary code generated by a last level of the one or more levels of reduction stage is a remainder of modulo-3 operation of the binary number.

19. The method of claim 18 further comprising selecting one of three memory channels using the remainder of modulo-3 operation of the binary number.

20. The method of claim 19 wherein the binary number is part of a memory address.

* * * * *